United States Patent
Tajima et al.

(10) Patent No.: US 9,590,009 B2
(45) Date of Patent: Mar. 7, 2017

(54) SEMICONDUCTOR LIGHT EMITTING ELEMENT

(71) Applicant: Kabushiki Kaisha Toshiba, Minato-ku (JP)

(72) Inventors: Jumpei Tajima, Koganei (JP); Hiroshi Ono, Setagaya (JP); Toshihide Ito, Minato (JP); Kenjiro Uesugi, Fuchu (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/823,193

(22) Filed: Aug. 11, 2015

(65) Prior Publication Data

US 2016/0056341 A1    Feb. 25, 2016

(30) Foreign Application Priority Data

Aug. 21, 2014   (JP) ................................. 2014-168803

(51) Int. Cl.
*H01L 33/62* (2010.01)
*H01L 27/15* (2006.01)
(Continued)

(52) U.S. Cl.
CPC ........ *H01L 27/156* (2013.01); *H01L 25/0753* (2013.01); *H01L 33/62* (2013.01);
(Continued)

(58) Field of Classification Search
CPC ....... H01L 33/405; H01L 33/38; H01L 33/08; H01L 27/153; H01L 27/156; H01L 25/0753
See application file for complete search history.

(56) References Cited

U.S. PATENT DOCUMENTS 7,488,988 B2   2/2009   Lin et al.
7,592,633 B2   9/2009   Shakuda
(Continued)

FOREIGN PATENT DOCUMENTS

JP    3904571      4/2007
JP    2010-87515   4/2010
(Continued)

OTHER PUBLICATIONS

Korean Office Action issued Aug. 22, 2016 in Korean Patent Application No. 10-2015-0114560 (with English translation), 13 pages.

*Primary Examiner* — Victor A Mandala
*Assistant Examiner* — Regan J Rundio
(74) *Attorney, Agent, or Firm* — Oblon, McClelland, Maier & Neustadt, L.L.P.

(57) ABSTRACT

A semiconductor light emitting element includes a base body, a first semiconductor layer, a second semiconductor layer, a first light emitting layer, a first conductive layer, a third semiconductor layer, a fourth semiconductor layer, a second light emitting layer, a second conductive layer, a first member, and a second member. The first member includes a first end portion and a second end portion. The first end portion is positioned between the base body and the first conductive layer and electrically connected to the first conductive layer, the second end portion not overlapping the second conductive layer. The second member includes a third end portion and a fourth end portion. The third end portion is positioned between the base body and the second conductive layer and electrically connected to the second conductive layer. The fourth end portion is electrically connected to the second end portion.

16 Claims, 5 Drawing Sheets

(51) Int. Cl.
  *H01L 33/38* (2010.01)
  *H01L 33/60* (2010.01)
  *H01L 25/075* (2006.01)
  *H01L 33/40* (2010.01)
  *H01L 33/20* (2010.01)
  *H01L 33/46* (2010.01)

(52) U.S. Cl.
  CPC .............. *H01L 33/20* (2013.01); *H01L 33/38* (2013.01); *H01L 33/405* (2013.01); *H01L 33/46* (2013.01)

(56) References Cited

U.S. PATENT DOCUMENTS

| | | | |
|---|---|---|---|
| 7,910,395 B2 | 3/2011 | Shei et al. | |
| 8,258,533 B2 | 9/2012 | Seo et al. | |
| 8,338,839 B2* | 12/2012 | Lerman | H01L 25/0753 257/100 |
| 8,390,021 B2 | 3/2013 | Nagai | |
| 2007/0284598 A1 | 12/2007 | Shakuda et al. | |
| 2009/0173956 A1* | 7/2009 | Aldaz | H01L 33/0079 257/94 |
| 2010/0078656 A1 | 4/2010 | Seo et al. | |
| 2011/0133219 A1* | 6/2011 | Chen | H01L 25/0753 257/88 |
| 2011/0220932 A1 | 9/2011 | Katsuno et al. | |
| 2011/0233587 A1 | 9/2011 | Unno | |
| 2012/0080695 A1* | 4/2012 | Lee | H01L 27/156 257/91 |
| 2012/0280269 A1* | 11/2012 | Jeong | H01L 33/405 257/99 |
| 2012/0326161 A1* | 12/2012 | Yokogawa | H01L 33/405 257/76 |
| 2013/0099272 A1* | 4/2013 | von Malm | H01L 25/0753 257/99 |
| 2013/0228819 A1* | 9/2013 | Engl | H01L 33/382 257/99 |

FOREIGN PATENT DOCUMENTS

| | | |
|---|---|---|
| JP | 2011-187873 | 9/2011 |
| JP | 2012-54422 | 3/2012 |
| JP | 2015-233086 A | 12/2015 |
| KR | 10-2013-0031254 A | 3/2013 |
| KR | 10-2013-0054416 A | 5/2013 |

* cited by examiner

SEMICONDUCTOR LIGHT EMITTING ELEMENT

CROSS-REFERENCE TO RELATED APPLICATIONS

This application is based upon and claims the benefit of priority from Japanese Patent Application No. 2014-168803, filed on Aug. 21, 2014; the entire contents of which are incorporated herein by reference.

FIELD

Embodiments described herein relate generally to a semiconductor light emitting element.

BACKGROUND

It is desirable to increase the efficiency of semiconductor light emitting elements such as light emitting diodes (LEDs), etc.

DETAILED DESCRIPTION

Figure 1:
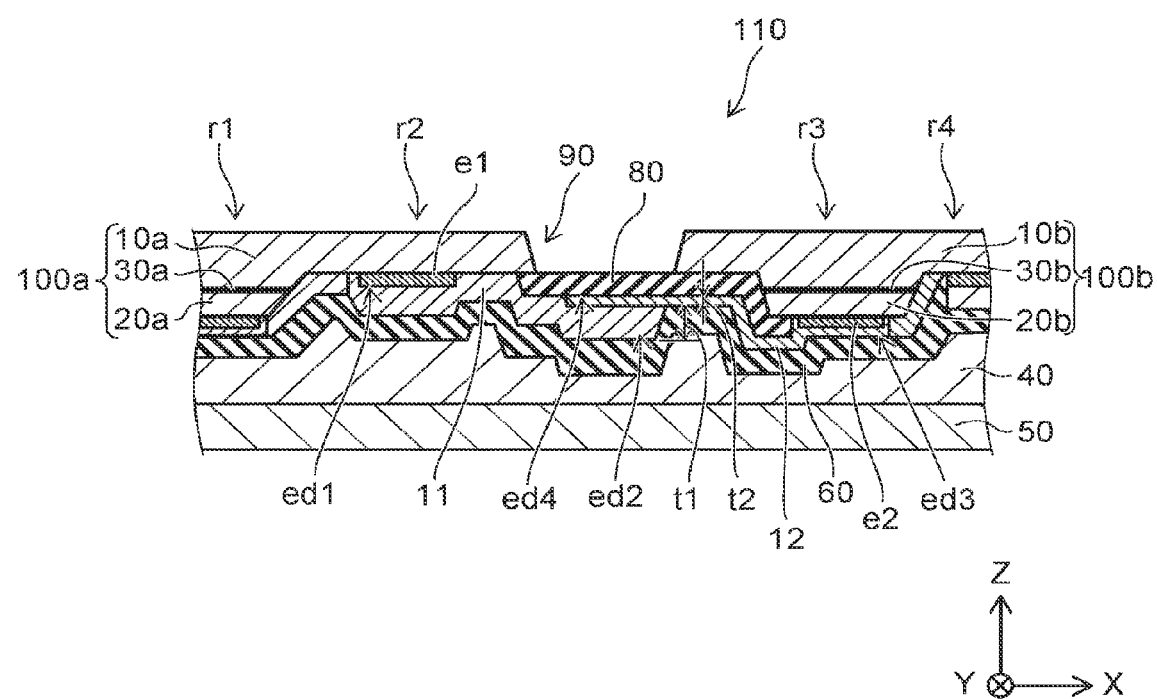
FIG. 1 is a schematic cross-sectional view showing a semiconductor light emitting element according to a first embodiment.

According to one embodiment, a semiconductor light emitting element includes a base body, a first semiconductor layer of a first conductivity type, a second semiconductor layer of a second conductivity type, a first light emitting layer, a first conductive layer, a third semiconductor layer of the first conductivity type, a fourth semiconductor layer of the second conductivity type, a second light emitting layer, a second conductive layer, a first member, and a second member. The first semiconductor layer is separated from the base body in a first direction, the first semiconductor layer includes a first region and a second region, the second region being arranged with the first region in a direction intersecting the first direction. The second semiconductor layer is provided between the base body and the first region. The first light emitting layer is provided between the first region and the second semiconductor layer. The first conductive layer is provided between the base body and the second region and electrically connected to the second region. The third semiconductor layer is separated from the base body in the first direction. The third semiconductor layer includes a third region and a fourth region, the fourth region being arranged with the third region in a direction intersecting the first direction. The fourth semiconductor layer is provided between the base body and the third region. The second light emitting layer is provided between the third region and the fourth semiconductor layer. The second conductive layer is provided between the base body and the fourth semiconductor layer and electrically connected to the fourth semiconductor layer. The first member includes a first end portion and a second end portion. The first end portion is positioned between the base body and the first conductive layer and electrically connected to the first conductive layer, the second end portion not overlapping the second conductive layer. The second member includes a third end portion and a fourth end portion. The third end portion is positioned between the base body and the second conductive layer and electrically connected to the second conductive layer. The fourth end portion is electrically connected to the second end portion.

Various embodiments of the invention will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

FIG. 1 is a schematic cross-sectional view showing a semiconductor light emitting element according to a first embodiment.

Figure 2:
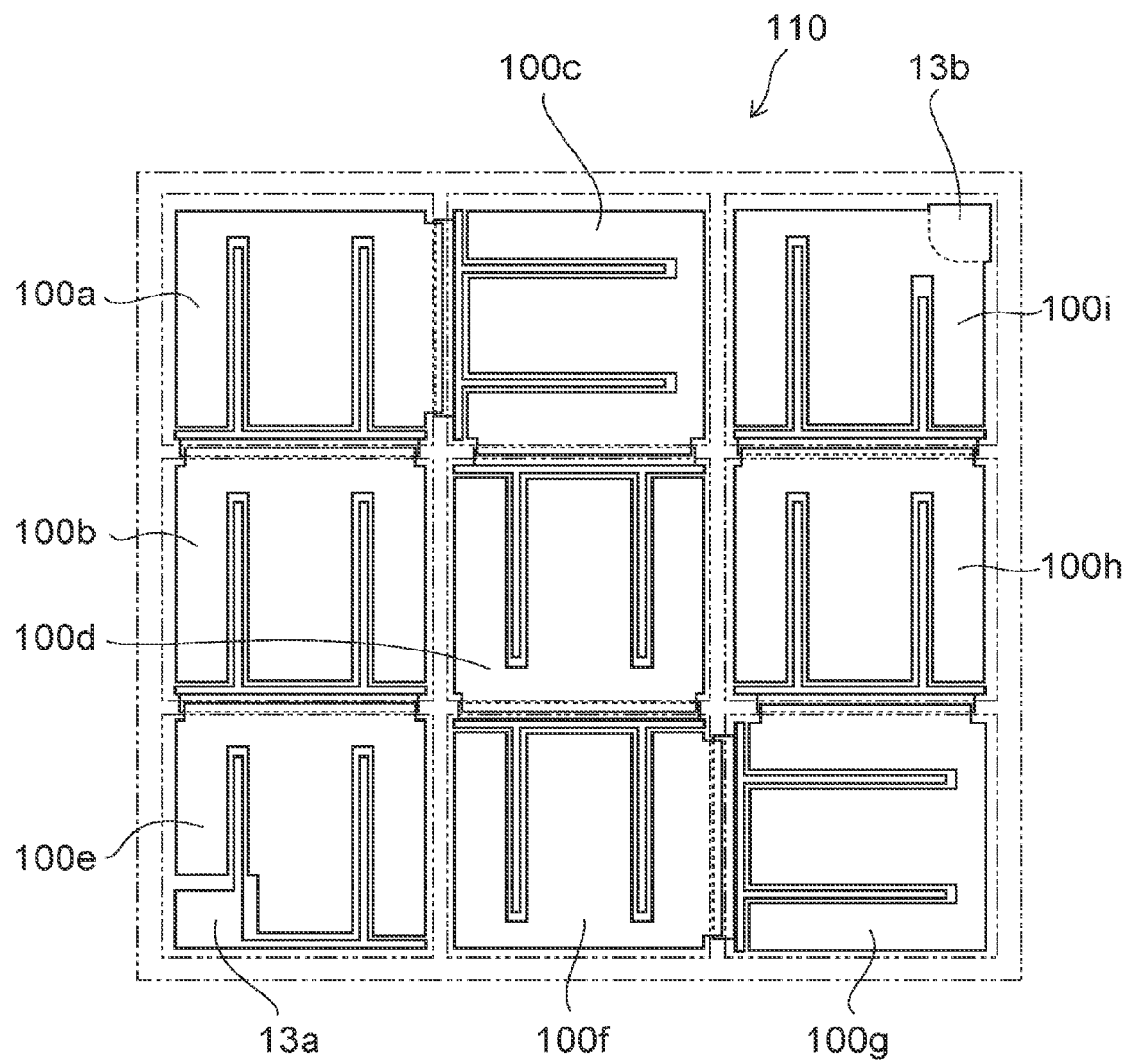
FIG. 2 is a schematic perspective plan view showing the semiconductor light emitting element according to the first embodiment.

FIG. 2 is a schematic perspective plan view showing the semiconductor light emitting element according to the first embodiment.

Some of the components shown in the cross-sectional view of FIG. 1 are not shown in the perspective plan view of FIG. 2 for easier viewing of the drawing.

As shown in FIG. 1, the semiconductor light emitting element 110 according to the embodiment includes a base body 50, a first semiconductor layer 10a, a second semiconductor layer 20a, a first light emitting layer 30a, a third semiconductor layer 10b, a fourth semiconductor layer 20b, a second light emitting layer 30b, a first conductive layer e1, a second conductive layer e2, a first inter-element interconnect (a first member) 11, and a second inter-element interconnect (a second member) 12.

As shown in FIG. 2, the semiconductor light emitting element 110 includes, for example, first to ninth stacked bodies 100a to 100i as nine stacked bodies. The example of FIG. 1 shows the cross section of the interconnect structure between the first stacked body 100a and the second stacked body 100b. The interconnect structures between the other stacked bodies are similar.

The first stacked body 100a includes a first semiconductor layer 10a, a second semiconductor layer 20a, and a first light emitting layer 30a. The second stacked body 100b includes a third semiconductor layer 10b, a fourth semiconductor layer 20b, and a second light emitting layer 30b. A separation trench 90 is provided between the first stacked body 100a and the second stacked body 100b.

The first semiconductor layer 10a is separated from the base body 50 in the first direction. The first direction is, for example, a Z-axis direction. The first semiconductor layer 10a includes a first region r1 and a second region r2. The second region r2 is arranged with the first region r1 in a direction (e.g., an X-axis direction) intersecting the Z-axis direction. The first semiconductor layer 10a has a first conductivity type.

The second semiconductor layer 20a is provided between the base body 50 and the first region r1. The second semiconductor layer 20a has a second conductivity type. For example, the first conductivity type is an n-type. The second conductivity type is a p-type. The first conductivity type may be the p-type; and the second conductivity type may be the n-type. Hereinbelow, the case is described where the first conductivity type is the n-type and the second conductivity type is the p-type.

The first light emitting layer 30a is provided between the first region r1 and the second semiconductor layer 20a.

The first conductive layer e1 is provided between the base body 50 and the second region r2. The first conductive layer e1 is electrically connected to the second region r2. The first conductive layer e1 is, for example, an n-side electrode.

The third semiconductor layer 10b is separated from the base body 50 in the Z-axis direction. The third semiconductor layer 10b includes a third region r3 and a fourth region r4. The fourth region r4 is arranged with the third region r3 in the X-axis direction. The third semiconductor layer 10b has the first conductivity type.

The fourth semiconductor layer 20b is provided between the base body 50 and the third region r3. The fourth semiconductor layer 20b has the second conductivity type.

The second light emitting layer 30b is provided between the third region r3 and the fourth semiconductor layer 20b.

Each of the semiconductor layers recited above includes, for example, a nitride semiconductor.

The second conductive layer e2 is provided between the base body 50 and the fourth semiconductor layer 20b. The second conductive layer e2 is electrically connected to the fourth semiconductor layer 20b. The second conductive layer e2 is, for example, a p-side electrode.

The first inter-element interconnect 11 includes a first end portion ed1 and a second end portion ed2. The first end portion ed1 is positioned between the base body 50 and the first conductive layer e1. The first end portion ed1 is electrically connected to the first conductive layer e1. The second end portion ed2 does not overlap the second conductive layer e2.

The second inter-element interconnect 12 includes a third end portion ed3 and a fourth end portion ed4. The third end portion ed3 is positioned between the base body 50 and the second conductive layer e2. The third end portion ed3 is electrically connected to the second conductive layer e2. The fourth end portion ed4 is electrically connected to the second end portion ed2. For example, the second inter-element interconnect 12 may be formed as one body with a protective metal layer (also called a barrier metal) by extending the protective metal layer.

In the specification of the application, the "state of being electrically connected" includes the state in which multiple conductors are in direct contact. The "state of being electrically connected" includes the state in which a current flows between multiple conductors that have another conductor disposed between the multiple conductors.

An insulating layer 60 is further provided in the semiconductor light emitting element 110. The insulating layer is provided between the base body 50 and the first inter-element interconnect 11 and between the base body 50 and the second inter-element interconnect 12.

A metal layer 40 is further provided in the semiconductor light emitting element 110. The metal layer 40 is provided between the base body 50 and the insulating layer 60.

According to the embodiment as shown in FIG. 1, the first inter-element interconnect 11 on the n-side includes the first end portion ed1 and the second end portion ed2; and the second end portion ed2 does not overlap the second conductive layer e2 on the p-side. The second inter-element interconnect 12 on the p-side includes the third end portion ed3 and the fourth end portion ed4; and the fourth end portion ed4 is electrically connected to the second end portion ed2.

For example, the overlapping portion of the first inter-element interconnect 11 on the n-side and the second inter-element interconnect 12 on the p-side does not overlap the second conductive layer e2 on the p-side. For example, the overlapping portion of the first inter-element interconnect 11 and the second inter-element interconnect 12 overlaps the separation trench 90 in the Z-axis direction. The width in the X-axis direction of the overlapping portion of the first inter-element interconnect 11 and the second inter-element interconnect 12 is, for example, not less than 2 μm and not more than 30 μm.

In the embodiment, because the second end portion ed2 does not overlap the second conductive layer e2 on the p-side, the difference between the Z-axis direction position of the second end portion ed2 and the Z-axis direction position of the third end portion ed3 can be set to be small. In other words, the difference in levels is small. The insulating layer 60 is bonded to the metal layer 40. Because the difference in levels can be small in the embodiment, the bonding surface of the insulating layer 60 can be flat even in the case where the insulating layer 60 is thin. Therefore, the stress applied when bonding is reduced; and damage of the element can be suppressed. Thereby, the productivity can be increased. If the insulating layer 60 is made thicker to reduce the difference in levels, the heat dissipation degrades. In the embodiment, good heat dissipation is obtained because the damage of the element can be suppressed even in the case where the insulating layer 60 is set to be thin. Thereby, the efficiency can be increased.

The first inter-element interconnect 11 is electrically connected to the first conductive layer e1. The first inter-element interconnect 11 has a first thickness t1. The second inter-element interconnect 12 is electrically connected to the second conductive layer e2. The second inter-element interconnect 12 has a second thickness t2. It is favorable for the first thickness t1 to be thicker than the second thickness t2. That is, the second thickness t2 of the second inter-element interconnect 12 is set to be thinner than the first thickness t1 of the first inter-element interconnect 11. The first thickness t1 is, for example, not less than 0.2 μm and not more than 3.0 μm. The second thickness t2 is, for example, not less than 0.1 μm and not more than 2.0 μm. Thereby, the increase of the thickness of the element can be suppressed more effectively.

Figure 3:
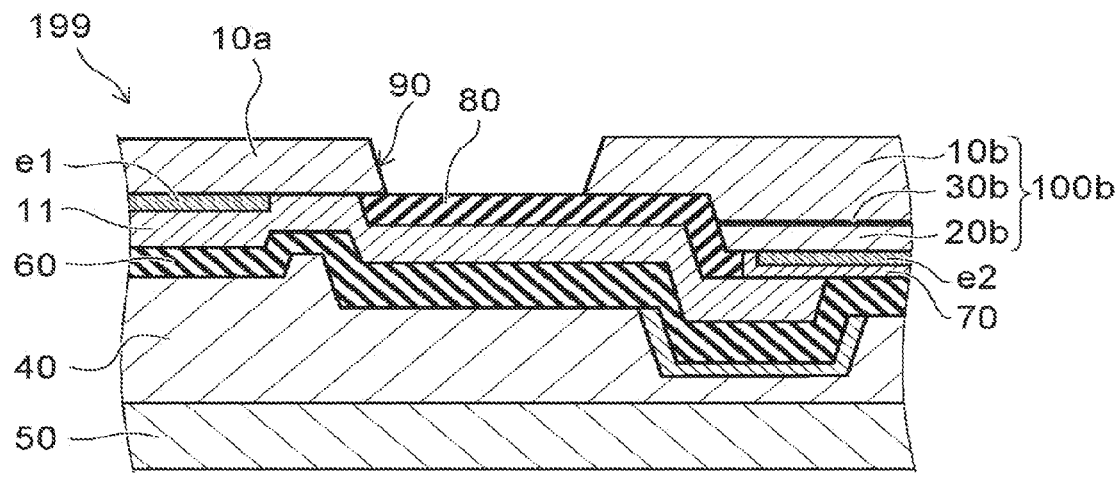
FIG. 3 is a schematic cross-sectional view showing a semiconductor light emitting element according to a reference example.

FIG. 3 is a schematic cross-sectional view showing a semiconductor light emitting element according to a reference example.

In the semiconductor light emitting element 199 according to the reference example, the first inter-element interconnect 11 extends to the second conductive layer e2 on the p-side. In other words, according to the reference example, the second conductive layer e2 on the p-side, a protective metal layer 70, and the first inter-element interconnect 11 overlap each other. The thickness of the element in the stacking direction partially increases due to the overlapping portion. In other words, an unevenness is formed in the bonding surface of the insulating layer 60. Therefore, stress is applied to the protrusion when the insulating layer 60 and the base body 50 are bonded by the metal layer 40; and there is a possibility that the element may be damaged. Even if the element is not damaged, there are cases where the stress is stored inside the element and the reliability decreases. There are cases where leaks of the element occur due to the insulating layer 60 breaking and causing shorts to the metal layer 40.

In the embodiment, the flatness of the bonding surface of the insulating layer 60 can be improved; the stress is reduced; and the damage of the element can be suppressed. Also, the efficiency can be increased.

The semiconductor light emitting element 110 further includes an inter-element insulation layer 80. The inter-element insulation layer 80 is provided between the third semiconductor layer 10b and the second inter-element interconnect 12 and between the second light emitting layer 30b and the second inter-element interconnect 12.

As shown in FIG. 2, the semiconductor light emitting element 110 includes, for example, the first to ninth stacked bodies 100a to 100i. In the first to ninth stacked bodies 100a to 100i, the p-electrode of one stacked body is connected in series to the n-electrode of one other stacked body arranged with the one stacked body.

The fifth stacked body 100e includes, for example, a first pad unit 13a on the n-side. The ninth stacked body 100i includes, for example, a second pad unit 13b on the p-side.

For example, a voltage is applied between the first pad unit 13a and the second pad unit 13b. Thereby, a current flows in the first to ninth stacked bodies 100a to 100i. Due to the current, light is emitted from the first light emitting layer 30a and the second light emitting layer 30b. In the example, the emitted light is emitted from the first semiconductor layer 10a and third semiconductor layer 10b side.

In the description recited above, the first conductive layer e1 and the second conductive layer e2 include light-reflective materials. For example, the conductive layers include at least one of aluminum (Al), silver (Ag), nickel (Ni), gold, or rhodium. Thereby, a high light reflectance is obtained. The first conductive layer e1 illustrated as the n-electrode includes, for example, Al or an Al alloy. The second conductive layer e2 illustrated as the p-electrode includes, for example, Ag, Ni, a Ag alloy, or a stacked structure of these metals.

For example, the second conductive layer e2 is formed by performing heat treatment in an oxygen atmosphere at not less than 250° C. and not more than 400° C. (e.g., 300° C.) for not less than 0.5 minutes and not more than 2 minutes (e.g., 1 minute). The concentration of the oxygen in the oxygen atmosphere is, for example, 50% or more. The concentration of the nitrogen in the oxygen atmosphere is, for example, 50% or less.

After performing the heat treatment in the nitrogen atmosphere at not less than 250° C. and not more than 400° C. (e.g., 300° C.) for not less than 0.5 minutes and not more than 2 minutes (e.g., 1 minute), heat treatment may be performed in an oxygen atmosphere at not less than 250° C. and not more than 400° C. (e.g., 300° C.) for not less than 0.5 minutes and not more than 2 minutes (e.g., 1 minute). For example, the reflectance increases; and the contact properties improve.

By applying the configuration recited above to the second conductive layer e2, good ohmic characteristics with the fourth semiconductor layer 20b are obtained. A low contact resistance with the fourth semiconductor layer 20b is obtained. Good electrical characteristics and a high light reflectance are obtained.

For example, the first conductive layer e1 is formed by performing heat treatment in a nitrogen atmosphere at not less than 300° C. and not more than 600° C. (e.g., 400° C.) for not less than 0.5 minutes and not more than 10 minutes (e.g., 1 minute). The concentration of the nitrogen in the nitrogen atmosphere is, for example, 90% or more. An inert gas such as argon, etc., may be used instead of nitrogen. The heat treatment may be performed at reduced pressure.

By applying the configuration recited above to the first conductive layer e1, good ohmic characteristics with the first semiconductor layer 10a are obtained. A low contact resistance with the first semiconductor layer 10a is obtained. Good electrical characteristics and a high light reflectance are obtained.

The first inter-element interconnect 11 and the second inter-element interconnect 12 also include light-reflective materials. The material of the first inter-element interconnect 11 includes, for example, Al or an Al alloy. The material of the second inter-element interconnect 12 includes, for example, Ag or a Ag alloy.

Figure 6:
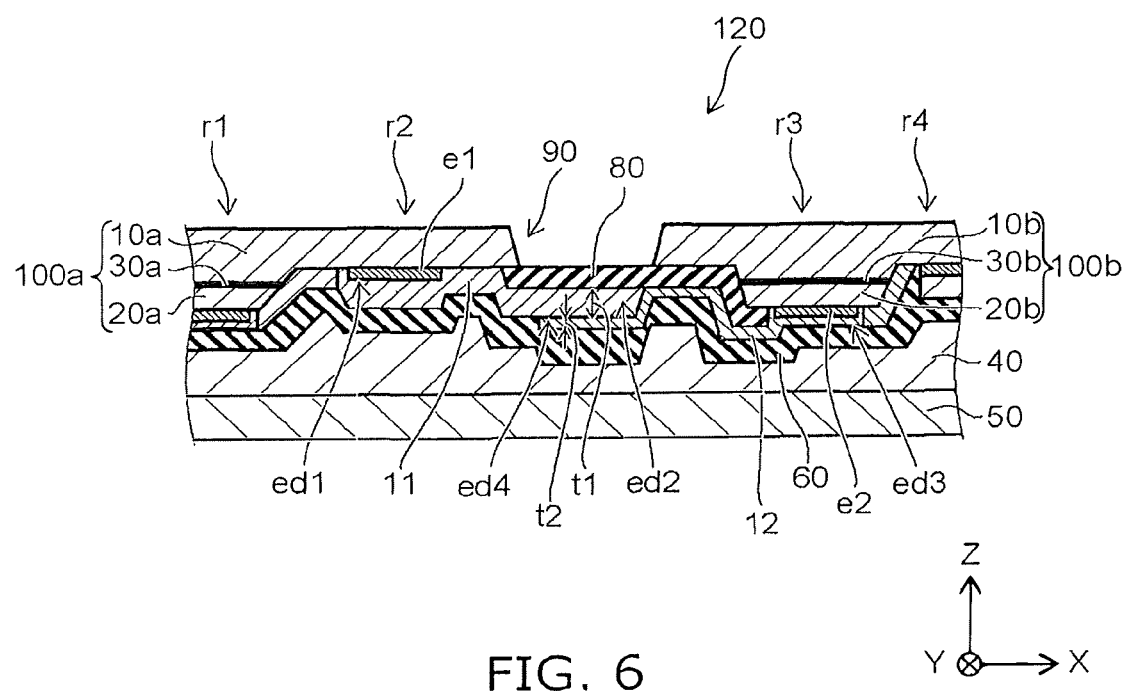
FIG. 6 is a schematic cross-sectional view showing a semiconductor light emitting element according to a variation of the first embodiment.

It is favorable for the second end portion ed2 of the first inter-element interconnect 11 to be positioned between the base body 50 and the fourth end portion ed4 of the second inter-element interconnect 12. That is, more efficient reflective characteristics can be obtained by providing the second inter-element interconnect 12, which has a higher reflectance than the first inter-element interconnect 11, on the light emitting surface side. The fourth end portion ed4 may be positioned between the second end portion ed2 and the base body 50, as shown in FIG. 6.

The metal layer 40 includes, for example, tin and at least one of gold or nickel. In other words, by considering the bondability, the metal layer 40 includes a metal such as Au—Sn, Ni—Sn, etc. Thereby, good bondability is obtained.

The light that is emitted from the light emitting layers (the first light emitting layer 30a and the second light emitting layer 30b) is reflected efficiently by the electrodes, the interconnects, etc. The light that is reflected is emitted to the outside efficiently from the light emitting surface. Thereby, a high light extraction efficiency is obtained.

On the other hand, the heat that is generated by the stacked body is dissipated efficiently by the base body 50. The base body 50 includes a material having a high thermal conductivity and good heat dissipation. The material of the base body 50 includes, for example, aluminum nitride, silicon, germanium, copper, etc. Thereby, good heat dissipation is obtained; and an excessive increase of the temperature of the stacked body is suppressed. Thereby, a high luminous efficiency is obtained. These materials also are applicable to the embodiments described below.

The peak wavelength of the light (the emitted light) emitted from the light emitting layer is, for example, not less than 400 nm and not more than 650 nm. However, in the embodiment, the peak wavelength is arbitrary.

The first semiconductor layer 10a includes, for example, a GaN layer including an n-type impurity. The n-type impurity may include at least one of Si, Ge, Te, or Sn. The first semiconductor layer 10a includes, for example, an n-side contact layer. This is similar for the third semiconductor layer 10b as well.

The second semiconductor layer 20a includes, for example, a GaN layer including a p-type impurity. The p-type impurity may include at least one of Mg, Zn, or C. The second semiconductor layer 20a includes, for example, a p-side contact layer. This is similar for the fourth semiconductor layer 20b as well.

The first stacked body 100a that includes the first semiconductor layer 10a, the second semiconductor layer 20a, and the first light emitting layer 30a is formed by, for example, epitaxial growth. The growth substrate may include, for example, one of Si, sapphire, GaN, SiC, or GaAs. The plane orientation of the growth substrate is arbitrary. This is similar for the second stacked body 100b as well.

The configurations of the first pad unit 13a and the second pad unit 13b are, for example, polygons (e.g., pentagons or higher), circles, flattened circles, etc. The widths of the pad units are, for example, not less than 50 micrometers (μm) and not more than 200 μm (e.g., 130 μm). For example, bonding wires are connected to the pad units. Widths (sizes) for which stable connections are possible are used.

The insulating layer 60 includes, for example, silicon oxide ($SiO_2$, etc.) and/or silicon nitride ($Si_3N_4$, etc.). For example, the insulating layer 60 is formed at a high temperature. Thereby, good insulative properties, good coverage, and good reliability are obtained for the insulating layer 60. The insulating layer 60 may be formed at a low temperature. By using the insulating layer 60, good spreading of the current is obtained; and the effective light emission surface area can be enlarged. The inter-element insulation layer 80 also includes, for example, silicon oxide ($SiO_2$, etc.).

In the example, the side surface of a portion of the first stacked body 100a and the side surface of a portion of the second stacked body 100b are tilted with respect to the Z-axis direction. In other words, a mesa configuration is applied. The travel direction of the light can be changed by the mesa configuration. The intensity of the light emitted from the light emitting layer is a maximum in a direction of about 30 degrees. The light traveling at the angle at which the intensity of the light is a maximum can be changed efficiently. The effect of the side surface configuration is more pronounced for this structure having the multiple stacked bodies.

According to the embodiment, a so-called multijunction structure in which operation at a high voltage and a low current is possible can be provided in a semiconductor light emitting element having a lateral-conduction thin film structure. In the embodiment, multiple stacked bodies are connected in series. The appropriate operating voltage for one stacked body is within a prescribed range. By connecting the multiple stacked bodies in series, the voltage that is applied to the two ends of the multiple stacked bodies connected in series is divided between the multiple stacked bodies. Thereby, even in the case where the voltage that is applied to the two ends is a high voltage, the voltage that is applied to each of the stacked bodies can be set to be within a desirable prescribed range. Using the voltage in the desirable prescribed range, the operation is obtained by a low current to realize high efficiency. In other words, operation of the multiple stacked bodies at a high voltage and a low current is obtained. Thereby, high efficiency is obtained for the multiple stacked bodies.

In one stacked body (element) according to the embodiment, for example, one n-electrode is interposed between two p-electrodes. At least two such stacked bodies are connected in series. Thereby, the light emission uniformity can be increased.

According to the embodiment, high reliability can be obtained because an inter-layer insulating layer is unnecessary between the p-electrode and the n-electrode. According to the embodiment, good heat dissipation can be obtained.

In the example shielding components such as interconnects, etc., are not provided at the light extraction surface. Thereby, a high light extraction efficiency is obtained. The inter-element interconnect is provided not at the light extraction surface but on the base body side. Thereby, a high light extraction efficiency is obtained.

Second Embodiment

Figure 4:
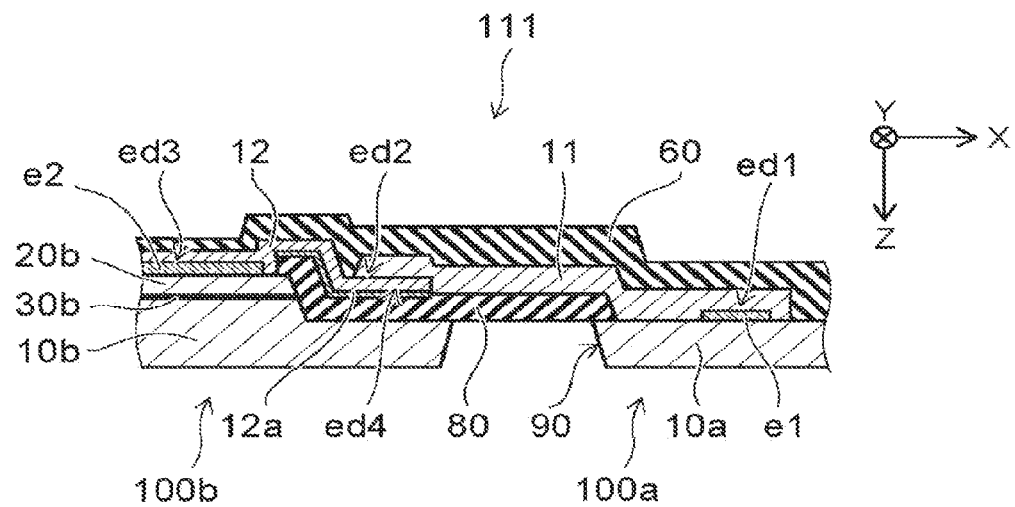
FIG. 4 is a schematic cross-sectional view showing a semiconductor light emitting element according to a second embodiment.

FIG. 4 is a schematic cross-sectional view showing a semiconductor light emitting element according to a second embodiment.

FIG. 4 shows another interconnect structure between the first stacked body 100a and the second stacked body 200b. As shown in FIG. 4, the semiconductor light emitting element 111 according to the embodiment includes the first stacked body 100a and the second stacked body 100b. In the example, the metal layer 40 and the base body 50 are not shown. In the embodiment, the overlapping portion of the first inter-element interconnect 11 on the n-side and the second inter-element interconnect 12 on the p-side overlaps the third semiconductor layer 10b in the Z-axis direction. The width in the X-axis direction of the overlapping portion of the first inter-element interconnect 11 and the second inter-element interconnect 12 is, for example, not less than 1 μm and not more than 15 μm.

Thereby, the partial increase of the thickness of the element in the stacking direction is suppressed; and the bonding surface of the insulating layer can be flat. Therefore, the stress applied when bonding is reduced; and the damage of the element can be prevented. Thereby, the reliability can be increased. Thereby, a highly reliable semiconductor light emitting element can be provided. Good heat dissipation is obtained; and high efficiency is obtained.

For example, a layer 12a including Ag may be provided on the light emitting surface side (the inter-element insulation layer 80 side) of the second inter-element interconnect 12. In other words, the layer 12a including Ag is provided between the second inter-element interconnect 12 and the inter-element insulation layer 80. Thereby, more efficient reflective characteristics can be obtained.

FIG. 5A to FIG. 5E are schematic cross-sectional views in order of the processes, showing a method for manufacturing the semiconductor light emitting element according to the embodiment.

In the example, the interconnect structure between the first stacked body 100a and the second stacked body 100b is shown.

A growth substrate (not shown) is prepared; and a first semiconductor film 10f, a light emitting film 30f, and a second semiconductor film 20f are sequentially formed in this order on the growth substrate. The formation of these films may include, for example, metal-organic chemical vapor deposition (MOCVD), metal-organic vapor phase epitaxy (MOVPE), molecular beam epitaxy (MBE), hydride vapor phase epitaxy (HVPE), etc. These films are epitaxially grown. The growth substrate includes, for example, a substrate of silicon, sapphire, spinel, GaAs, InP, ZnO, Ge, SiGe, SiC, etc.

Figure 5A:
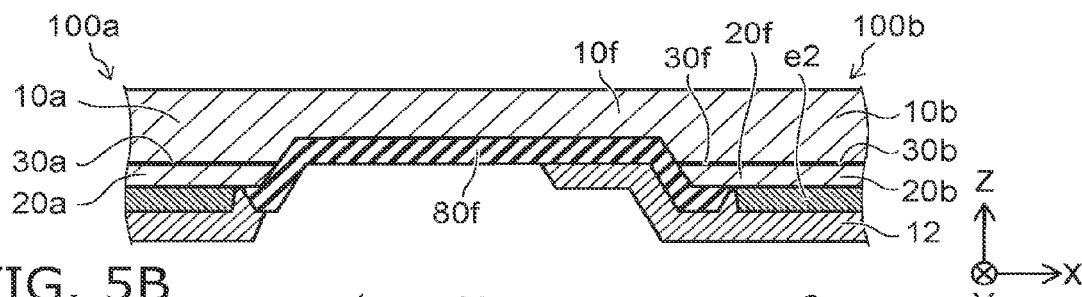
FIG. 5A to FIG. 5E are schematic cross-sectional views in order of the processes, showing a method for manufacturing the semiconductor light emitting element according to the embodiment.

As shown in FIG. 5A, the first stacked body 100a and the second stacked body 100b are formed by removing a portion of the first semiconductor film 10f, a portion of the light emitting film 30f, and a portion of the second semiconductor film 20f. The first stacked body 100a includes the first semiconductor layer 10a, the second semiconductor layer 20a, and the first light emitting layer 30a. The second stacked body 100b includes the third semiconductor layer 10b, the fourth semiconductor layer 20b, and the second light emitting layer 30b. The patterning of the removal includes, for example, RIE (Reactive Ion Etching). For example, a gas including chlorine is used in the RIE. The first semiconductor layer 10a and the third semiconductor layer 10b are continuous at this time and are separated in a process described below.

An insulating film 80f is formed on the stacked body recited above. For example, CVD (Chemical Vapor Deposition), sputtering, SOG (Spin On Glass), or the like is used for the insulating film 80f. The insulating film 80f includes, for example, silicon oxide such as $SiO_2$, etc.

A portion of the insulating film 80f is removed. The second conductive layer e2 and the second inter-element interconnect 12 on the p-side are formed in order on the fourth semiconductor layer 20b exposed by removing the portion of the insulating film 80f.

Figure 5B:
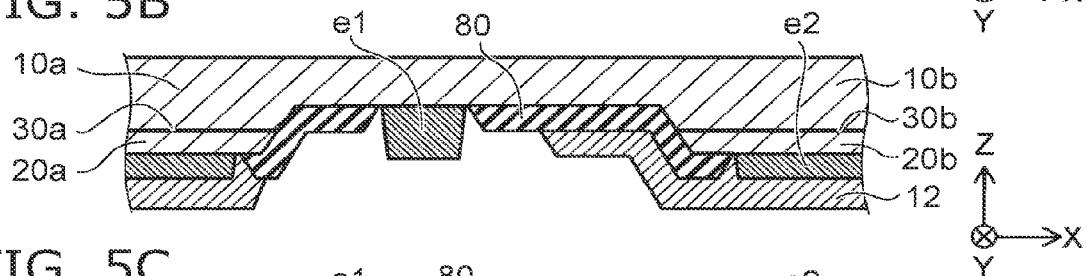

As shown in FIG. 5B, the inter-element insulation layer 80 is formed by removing the portion of the insulating film 80f. The first conductive layer e1 on the n-side is formed on the first semiconductor layer 10a exposed by removing the portion of the insulating film 80f.

Figure 5C:
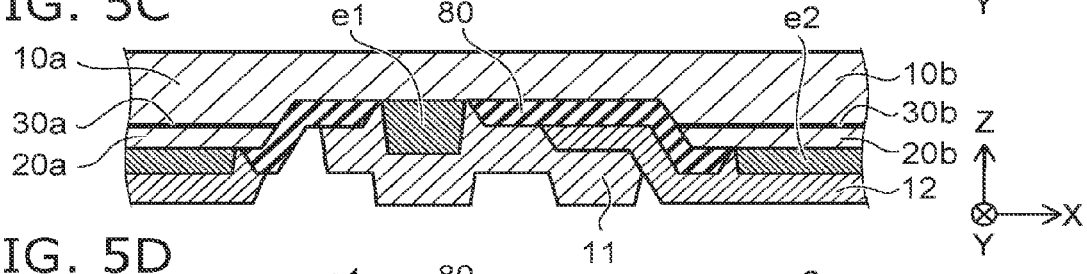

As shown in FIG. 5C, the first inter-element interconnect 11 is formed on the first conductive layer e1 on the n-side. The first inter-element interconnect 11 may be formed simultaneously with the first conductive layer e1.

Figure 5D:
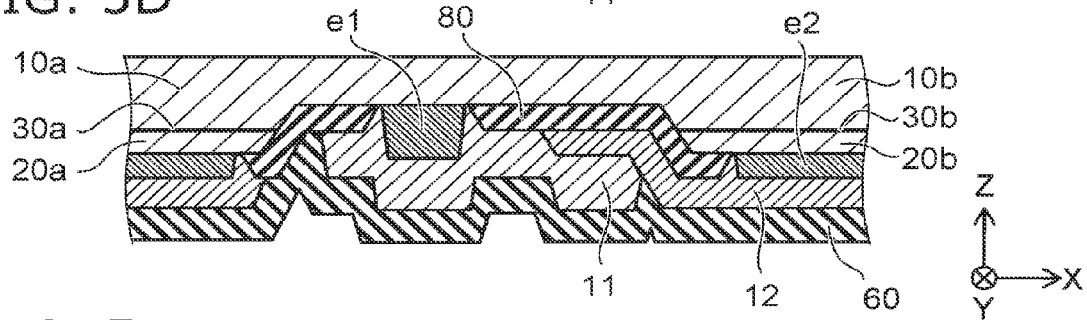

The insulating layer 60 is formed as shown in FIG. 5D. For example, CVD, sputtering, SOG, etc., may be used for the insulating layer 60. The insulating layer 60 includes, for example, silicon oxide such as $SiO_2$, etc.

Figure 5E:
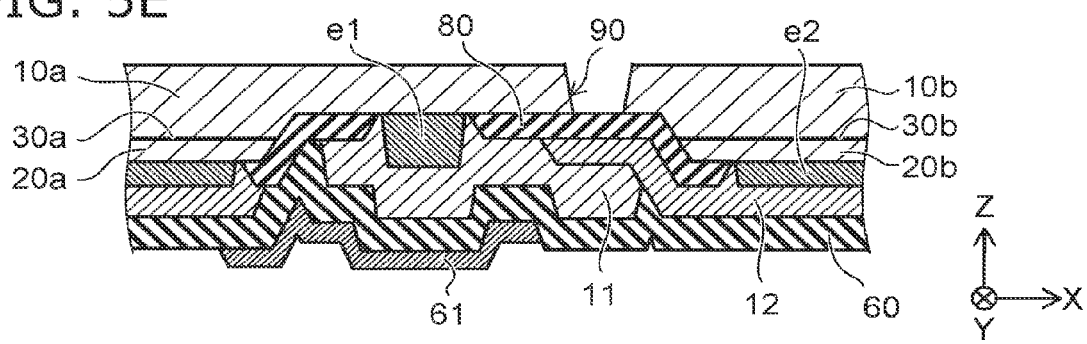

As shown in FIG. 5E, a reflective layer 61 that is made of a metal is formed on the insulating layer 60. The reflective layer 61 includes, for example, Ag or a Ag alloy. The first semiconductor layer 10a and the third semiconductor layer 10b are formed by dividing the first semiconductor film 10f. Thereby, the separation trench 90 is made. Thus, the semiconductor light emitting element 110 is formed.

According to the embodiments, a highly efficient semiconductor light emitting element can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, embodiments of the invention are described with reference to specific examples. However, the invention is not limited to these specific examples. For example, one skilled in the art may similarly practice the invention by appropriately selecting specific configurations of components such as the base body, the semiconductor layer, the light emitting layer, the conductive layer, the inter-element interconnect, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor light emitting elements practicable by an appropriate design modification by one skilled in the art based on the semiconductor light emitting elements described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element, comprising:
   a base body;
   a first semiconductor layer of a first conductivity type separated from the base body in a first direction, the first semiconductor layer including a first region and a second region, the second region being arranged with the first region in a direction intersecting the first direction;
   a second semiconductor layer of a second conductivity type provided between the base body and the first region;
   a first light emitting layer provided between the first region and the second semiconductor layer;
   a first conductive layer provided between the base body and the second region, the first conductive layer being directly in contact with and electrically connected to the second region;
   a third semiconductor layer of the first conductivity type separated from the base body in the first direction, the third semiconductor layer including a third region and a fourth region, the fourth region being arranged with the third region in a direction intersecting the first direction;
   a fourth semiconductor layer of the second conductivity type provided between the base body and the third region;
   a second light emitting layer provided between the third region and the fourth semiconductor layer;
   a second conductive layer provided between the base body and the fourth semiconductor layer and electrically connected to the fourth semiconductor layer;
   a first member including a first end portion and a second end portion, the first end portion being positioned between the base body and the first conductive layer and electrically connected to the first conductive layer, the second end portion not overlapping the second conductive layer; and
   a second member including a third end portion and a fourth end portion, the third end portion being positioned between the base body and the second conductive layer and electrically connected to the second conductive layer, the fourth end portion being electrically connected to the second end portion, wherein the second end portion is positioned between the fourth end portion and the base body or the fourth end portion is positioned between the second end portion and the base body.

2. The element according to claim 1, wherein a thickness of the first member is thicker than a thickness of the second member.

3. The element according to claim 1, wherein the first member includes aluminum, and the second member includes silver.

4. The element according to claim 1, further comprising an insulating layer provided between the base body and the first member and between the base body and the second member.

5. The element according to claim 4, wherein the insulating layer includes at least one of silicon oxide or silicon nitride.

6. The element according to claim 4, further comprising a metal layer provided between the base body and the insulating layer.

7. The element according to claim 6, wherein the metal layer includes tin and at least one of gold or nickel.

8. The element according to claim 1, further comprising an inter-element insulation layer provided between the third semiconductor layer and the second member and between the second light emitting layer and the second member.

9. The element according to claim 8, wherein the inter-element insulation layer includes silicon oxide.

10. A semiconductor light emitting element, comprising:
a base body;
a first semiconductor layer of a first conductivity type separated from the base body in a first direction, the first semiconductor layer including a first region and a second region, the second region being arranged with the first region in a direction intersecting the first direction;
a second semiconductor layer of a second conductivity type provided between the base body and the first region;
a first light emitting layer provided between the first region and the second semiconductor layer;
a first conductive layer provided between the base body and the second region, the first conductive layer being directly in contact with and electrically connected to the second region;
a third semiconductor layer of the first conductivity type separated from the base body in the first direction, the third semiconductor layer including a third region and a fourth region, the fourth region being arranged with the third region in a direction intersecting the first direction;
a fourth semiconductor layer of the second conductivity type provided between the base body and the third region;
a second light emitting layer provided between the third region and the fourth semiconductor layer;
a second conductive layer provided between the base body and the fourth semiconductor layer and electrically connected to the fourth semiconductor layer;
a first member including a first end portion and a second end portion, the first end portion being positioned between the base body and the first conductive layer and electrically connected to the first conductive layer, the second end portion not overlapping the second conductive layer; and
a second member including a third end portion and a fourth end portion, the third end portion being positioned between the base body and the secondconductive layer and electrically connected to the second conductive layer, the fourth end portion being electrically connected to the second end portion,
wherein
a separation trench is provided between the first semiconductor layer and the third semiconductor layer in the direction intersecting the first direction, and
the separation trench overlaps, in the first direction, a portion where the first member and the second member overlap.

11. The element according to claim 1, wherein the third semiconductor layer overlaps, in the first direction, a portion where the first member and the second member overlap.

12. The element according to claim 1, wherein the base body includes at least one of aluminum nitride, silicon, germanium, or copper.

13. The element according to claim 1, wherein
the first conductive layer includes aluminum, and
the second conductive layer includes silver.

14. A semiconductor light emitting element, comprising:
a base body;
a first semiconductor layer of a first conductivity type separated from the base body in a first direction, the first semiconductor layer including a first region and a second region, the second region being arranged with the first region in a direction intersecting the first direction;
a second semiconductor layer of a second conductivity type provided between the base body and the first region;
a first light emitting layer provided between the first region and the second semiconductor layer;
a first conductive layer provided between the base body and the second region and electrically connected to the second region, the first conductive layer not overlapping the second semiconductor layer in the first direction;
a third semiconductor layer of the first conductivity type separated from the base body in the first direction, the third semiconductor layer including a third region and a fourth region, the fourth region being arranged with the third region in a direction intersecting the first direction;
a fourth semiconductor layer of the second conductivity type provided between the base body and the third region;
a second light emitting layer provided between the third region and the fourth semiconductor layer;
a second conductive layer provided between the base body and the fourth semiconductor layer and electrically connected to the fourth semiconductor layer;
a first member including a first end portion and a second end portion, the first end portion being positioned between the base body and the first conductive layer and electrically connected to the first conductive layer, the second end portion not overlapping the second conductive layer; and
a second member including a third end portion and a fourth end portion, the third end portion being positioned between the base body and the second conductive layer and electrically connected to the second conductive layer, the fourth end portion being electrically connected to the second end portion, wherein the second end portion is positioned between the fourth end portion and the base body or the fourth end portion is positioned between the second end portion and the base body.

15. The element according to claim 14, wherein a thickness of the first member is thicker than a thickness of the second member.

16. The element according to claim 14, further comprising an insulating layer provided between the base body and the first member and between the base body and the second member.

* * * * *